United States Patent
Karanicolas

(10) Patent No.: US 6,654,214 B1
(45) Date of Patent: Nov. 25, 2003

(54) ELECTROSTATIC DISCHARGE COMPATIBLE VOLTAGE REFERENCE BUFFER

(75) Inventor: Andrew N. Karanicolas, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 09/721,554

(22) Filed: Nov. 22, 2000

(51) Int. Cl.[7] ................................................ H02H 9/00
(52) U.S. Cl. .......................................... 361/56; 327/310
(58) Field of Search ........................... 361/56, 111, 119, 361/91.1, 91.2; 307/108; 327/111, 309, 310, 318, 337; 341/126, 132, 144; 257/355–359

(56) References Cited

U.S. PATENT DOCUMENTS 5,552,748 A * 9/1996 O'Shaughnessy ........... 331/1 A
5,850,195 A * 12/1998 Berlien et al. .............. 341/137

* cited by examiner

*Primary Examiner*—Ronald W. Leja
(74) *Attorney, Agent, or Firm*—Seth Z. Kalson

(57) ABSTRACT

Electrostatic discharge protection is provided to an integrated circuit in which, for a particular embodiment, the integrated circuit comprises a switched capacitor circuit having a plurality of groups of voltage reference input ports; and a plurality of electrostatic discharge resistors coupled to a pad, wherein each electrostatic discharge resistor is coupled to a unique group of voltage reference input ports.

24 Claims, 4 Drawing Sheets

ELECTROSTATIC DISCHARGE COMPATIBLE VOLTAGE REFERENCE BUFFER

FIELD

Embodiments according to the present invention relate to integrated circuits, and more particularly, to electrostatic discharge protection of discrete time switched capacitor analog circuits.

BACKGROUND

For many discrete time (or sampled-data) analog circuits, such as for example an ADC (Analog-to-Digital Converter), it is desirable to provide one or more voltage reference buffers with low impedance. For many applications, voltage reference buffers are bypassed with external capacitors. A relatively large external capacitor may help a voltage reference buffer provide a constant reference voltage due to the charge reservoir stored in the external capacitor. As a result, a bypassed voltage reference buffer is connected to an external pin on an IC (Integrated Circuit) so that the external capacitor may be connected to the voltage reference buffer.

This is illustrated in FIG. 1, where voltage reference buffer 102 is bypassed by external capacitor 104, and voltage reference buffer 106 is bypassed by external capacitor 108. Capacitors 104 and 108 are connected to pads 110 and 112, respectively, via bond wires 114 and 116, respectively. In FIG. 1, differential signal notation is employed, where a differential signal x means that the actual voltage is x above a common-mode voltage. For example, voltage reference buffer 102 provides a differential voltage $V_{ref}$ and voltage reference buffer 106 provides a differential voltage $-V_{ref}$, but the actual reference voltage provided by reference buffer 102 is a voltage $V_{ref}$ above a common-mode voltage and the actual reference voltage provided by reference buffer 106 is a voltage $V_{ref}$ below the common-mode voltage. Furthermore, in practice both differential voltages $V_{ref}$ and $-V_{ref}$ may be realized at the output port of a differential amplifier (not shown), but for simplicity two separate reference buffer circuits are indicated in FIG. 1.

Because voltage reference buffers 102 and 106 drive external pins on IC 118, there should be compatibility with ESD (Electrostatic Discharge) protection. Usually, ESD protection is comprised of primary and secondary ESD protection. Primary ESD protection often involves the use of CMOS (Complementary Metal Oxide Semiconductor) devices having relatively very large dimensions, and located close to the pad (or pads) that will in turn be connected to an external pin (or pins). Secondary ESD protection often involves the use of CMOS devices with much smaller dimensions than those used for primary ESD protection.

ESD current is limited between the primary and secondary ESD sections of an IC by using one or more resistors. For many CMOS technologies, these resistors may be on the order of 75Ω. Because secondary ESD protection involves relatively small devices, it is often used for complex core circuits such as ADCs or DACs (Digital-to-Analog Converter). This is illustrated in FIG. 1, where dashed lines 102 indicate boundaries between sections involving primary and secondary ESD protection. Resistors 122 limit current between the primary and secondary ESD sections.

Although the use of secondary ESD protection is usually practical for ADCs and DACs, the series ESD 75Ω resistors used to limit current between the primary and secondary ESD sections may lead to voltage reference buffer circuits with too large of an impedance. In particular, for switched capacitor circuits, the combination of capacitors and the 75Ω ESD resistors may lead to a RC time constant that is too large. This is illustrated in FIG. 1, where capacitors 124 are switched so as to be connected to voltage reference buffer circuit 102 and capacitors 126 are switched so as to be connected to voltage reference buffer circuit 106. If these capacitors are switched so as to be connected in parallel to one another, then the effective capacitance in series with the ESD resistors may lead to unacceptably high RC time constants. This may not be compatible with high switching speeds because the individual capacitors do not have time to be charged or discharged sufficiently close to their asymptotic values.

DESCRIPTION OF THE EMBODIMENTS

Embodiments of the present invention are motivated by the observation that for some switched capacitor circuits, and in particular pipelined, switched capacitor ADCs, it is not necessary to provide exactly the same voltage reference to all parts of the circuit that nominally require the same voltage reference, provided the individual voltage references reach substantially the same asymptotic value within a switching interval. By relaxing the usual requirement of providing uniform voltage references, it is possible to segment many switched capacitor circuits into groups, where each group is provided with primary ESD protection independently of the other groups. In particular, for switched capacitor circuits comprising stages, such as a pipelined ADC, the stages may be grouped into groups, with each group provided with primary ESD protection independently of the other groups. As well be described later, this reduces the additive effect of having an unacceptably large number of capacitors switched in parallel, and consequently the overall RC time constant is reduced compared to the prior art.

Figure 1:
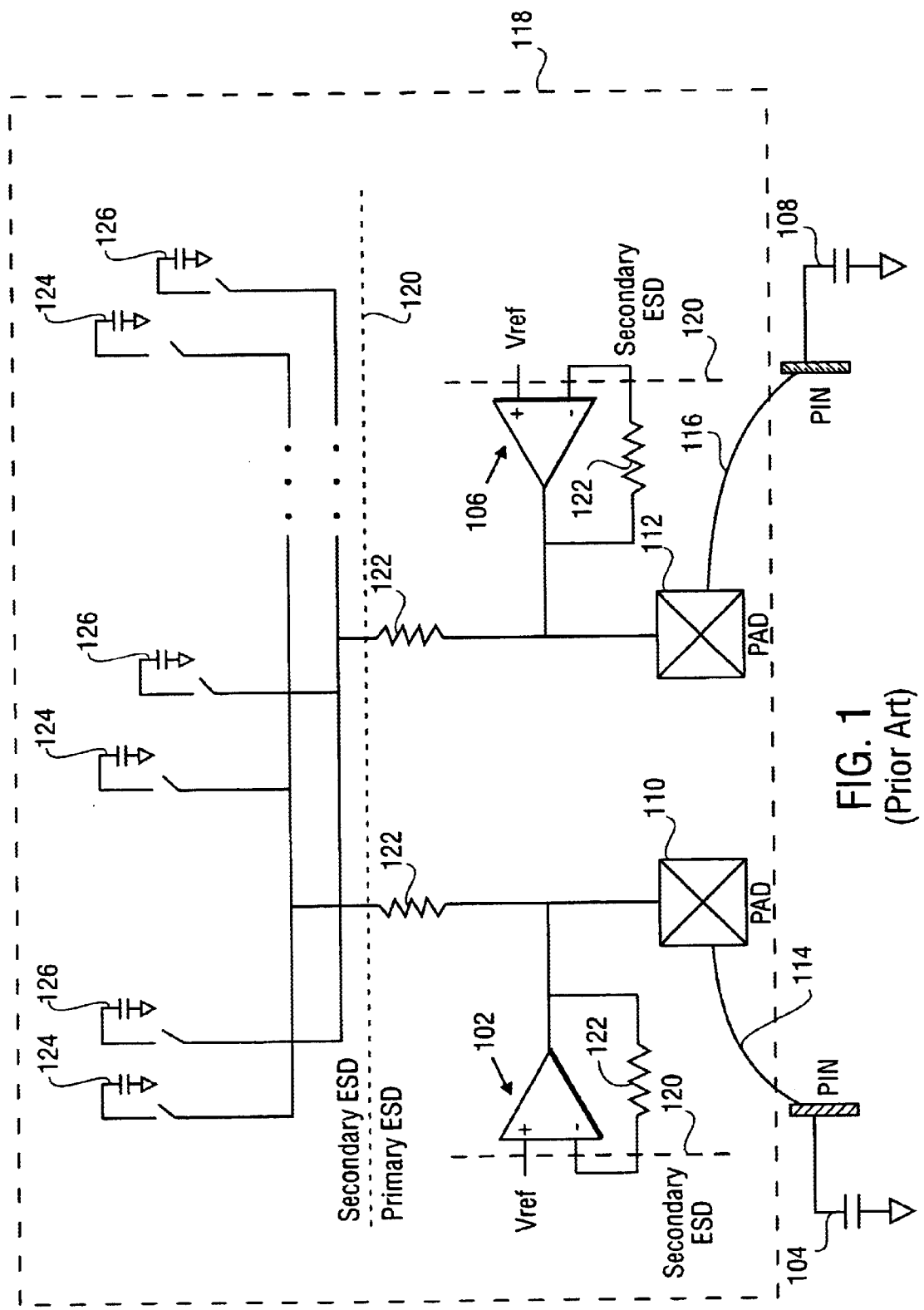
FIG. 1 illustrates prior art ESD protection for a switched capacitor circuit.
Figure 2:
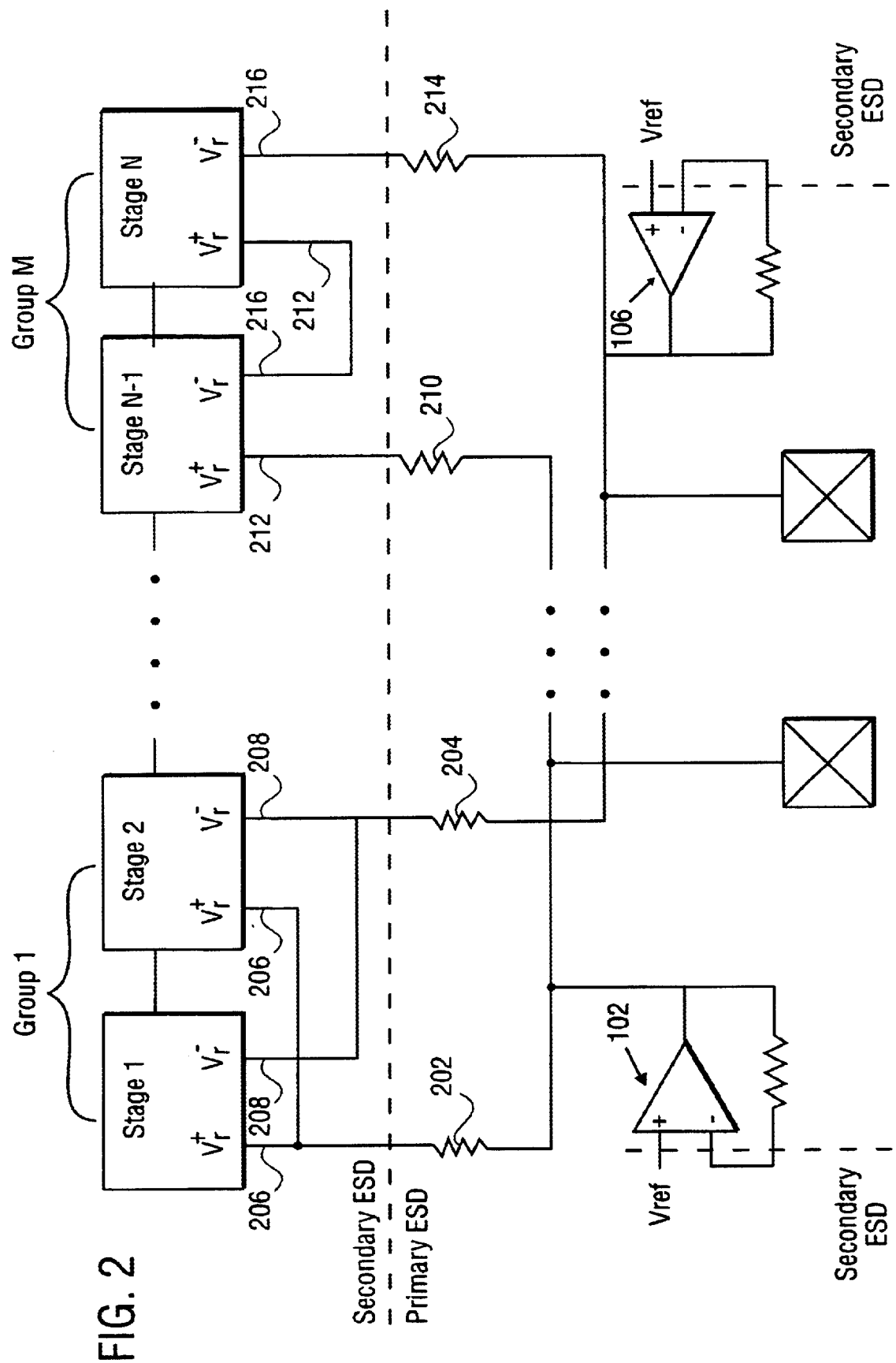
FIG. 2 illustrates ESD protection for a switched capacitor system according to an embodiment of the present invention.

FIG. 2 illustrates a high-level functional diagram of a switched capacitor circuit comprising stages, in which the stages are grouped two to a group. (For simplicity, an even number of stages is assumed. Otherwise, one group would comprise only one stage.) The switched capacitor circuit of FIG. 2 may be part of a communication circuit in which a received analog signal is converted to a digital signal. As in FIG. 1, differential signal notation is employed in FIG. 2. Each stage has two voltage reference input ports, one labeled as $V_r^+$ and the other as $V_r^-$. The nominal differential voltage signals applied to the former and later ports are, respectively, $V_{ref}$ and $-V_{ref}$. The $V_r^+$ ports are coupled to reference buffer circuit 102 and the $V_r^-$ ports are coupled to reference buffer circuit 106. However, the $V_r^+$ ports for a group of stages has its own series ESD resistor distinct from the ESD resistors for the other groups. A similar statement applies to the $V_r^-$ ports.

For example, in the embodiment of FIG. 2 the first group of stages comprising stages 1 and 2 has $V_r^+$ ports 206 coupled to reference buffer circuit 102 via ESD resistor 202, and $V_r^-$ ports coupled to reference buffer circuit 106 via ESD resistor 204. The last group comprising stages N−1 and N has $V_r^+$ ports 212 coupled to reference buffer circuit 102 via ESD resistor 210, and $V_r^-$ ports 216 coupled to reference buffer circuit 106 via ESD resistor 214. In this way, the number of capacitors switched in parallel for each series ESD resistor is only the number of switched capacitors in the two stages that are connected to the ESD resistor. Consequently, the RC time constants are reduced compared to prior art electrostatic discharge protection schemes. The resistance for each ESD resistor is nominally 75Ω. The switched capacitors are often nMOSFETs (n-Metal Oxide Semiconductor Field Effect Transistor) with gates connected to sources.

The voltages applied to the $V_r^+$ and $V_r^-$ ports are not necessarily equal for all stages. This is particularly the case when charge is being transported among the switched capacitors within a stage, because currents flowing through the various ESD resistors will vary for the different stages depending upon the initial states and input voltages of the capacitors at the beginning of a switching interval. However, provided the stages are grouped so that $$R_{ESD} \sum_i C_i$$

is sufficiently smaller than the switching interval, where $R_{ESD}$ denotes the nominal resistance of an ESD resistor and $$\sum_i C_i$$

is the total capacitance switched in a group of stages connected to a particular ESD resistor, then the various switched capacitors will have time to settle to their asymptotic states after a switching interval is initiated, the currents through the various ESD resistors will decay, and the voltages applied to the $V_r^+$ and $V_r^-$ ports will be substantially equal to $V_{ref}$ and $-V_{ref}$, respectively, at the end of the switching interval. For many types of switched capacitor circuits, it is only necessary that the reference voltages applied to the individual stages be substantially uniform at the end of a switching interval, not uniform throughout a switching interval. Consequently, for such circuits, ESD protection may be applied individually to groups of small numbers of stages so as to reduce RC time constants.

Figure 3:
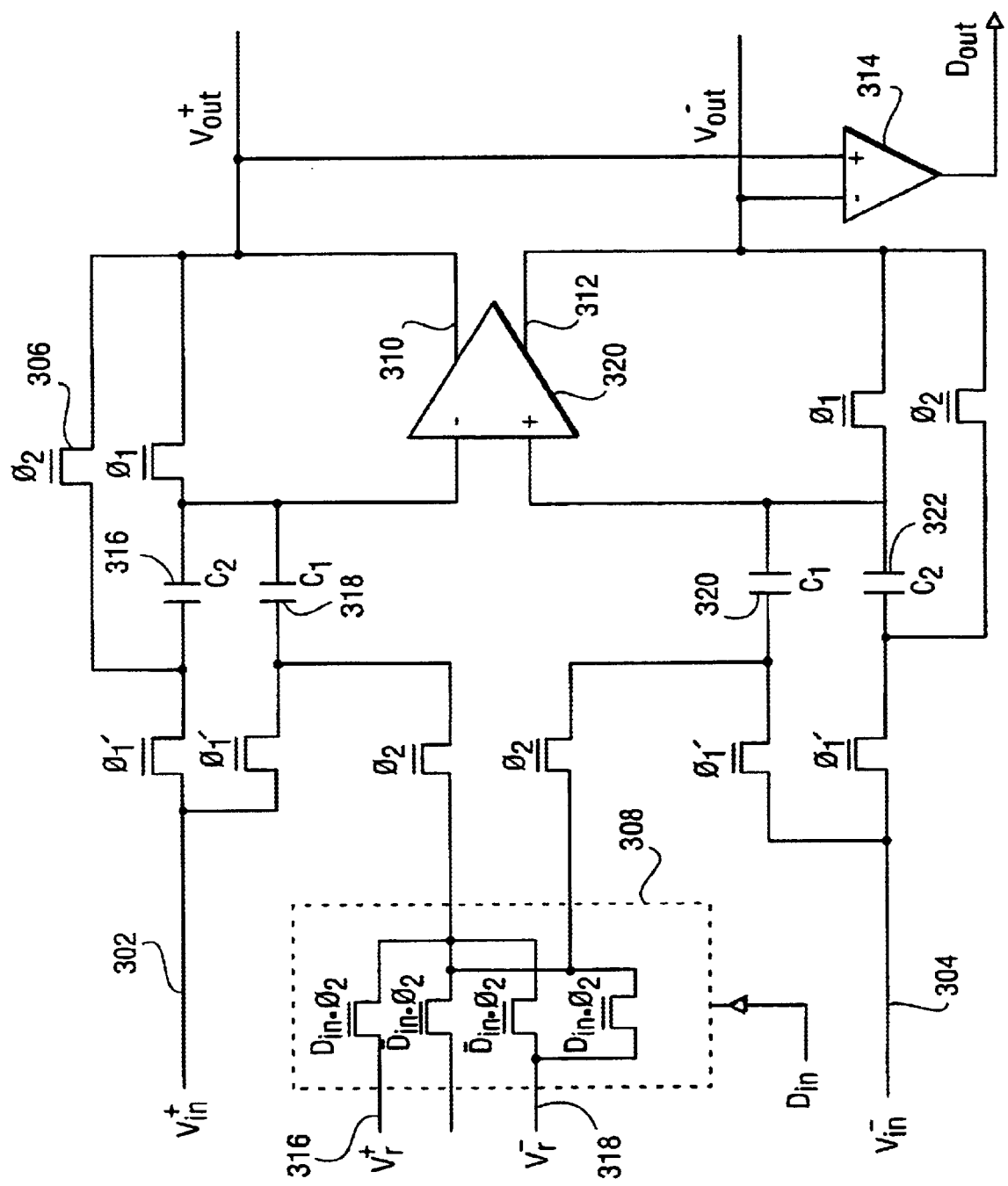
FIG. 3 is a switched capacitor circuit for one stage of a pipelined ADC.

One example of such a circuit is a pipelined, switched capacitor ADC. This circuit may be segmented into stages of switched capacitor circuits in which, for accurate analog to digital conversion, the voltage references for each stage need not be equivalent to one another for an entire switching interval, but need only approach uniform asymptotes near the end of a switching interval. A typical stage for such a pipelined ADC is illustrated in FIG. 3. Input analog differential voltage signals are provided at input ports 302 and 304. The differential voltage at input port 302 is denoted as $V_{IN}^+$, and the differential voltage at input port 304 is denoted as $V_{IN}^-$. In the ideal case, $V_{IN}^+ = -V_{IN}^-$. The $V_r^+$ and $V_r^-$ ports are labeled as 316 and 318, respectively. Output analog differential voltage signals $V_{OUT}^+$ and $V_{OUT}^-$ are provided at output ports 310 and 312, respectively, of differential amplifier 320. In the ideal case, $V_{OUT}^+ = -V_{OUT}^-$.

Figure 4:
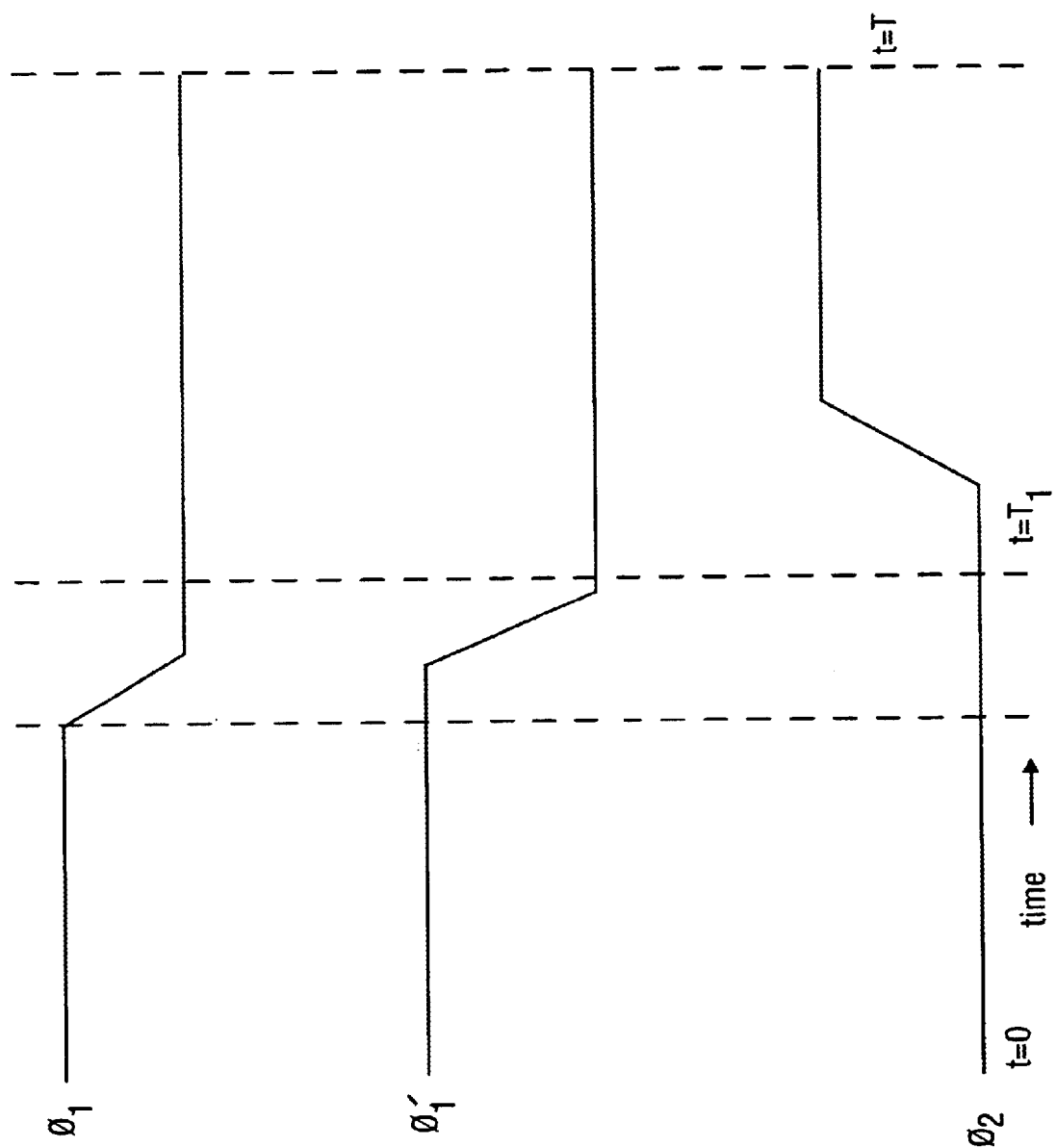
FIG. 4 is a timing diagram for the circuit of FIG. 3.

In FIG. 3, $\phi_1'$, $\phi_1$, and $\phi_2$ denote clock signals, where $\phi_1'$ is a slightly delayed version of $\phi_1$. A clock cycle of period T for $\phi_1'$, $\phi_1$, and $\phi_2$ is shown in FIG. 4. Various nMOSFETs shown in FIG. 3 are clocked according to the Boolean symbol above their respective gates. For example, nMOSFET 306 is ON if clock signal $\phi_2$ is HIGH (logical "1") and is OFF if clock signal $\phi_2$ is LOW (logical "0"). $D_{IN}$ is an input bit ("0" or "1") used to control the gates of nMOSFETs within sub-DAC 308. $D_{OUT}$ is an output bit provided by comparator 314, and is a logical "1" if $V_{OUT}^+ > V_{OUT}^-$ and is a logical "0" if $V_{OUT}^+ < V_{OUT}^-$. The differential voltage signals $V_{OUT}^+$ and $V_{OUT}^-$, and the output bit $D_{OUT}$, are provided as inputs to the next higher stage, so that $V_{OUT}^+$ and $V_{OUT}^-$ become, respectively, $V_{IN}^+$ and $V_{IN}^-$, and $D_{OUT}$ becomes $D_{IN}$ for the next higher stage. For the first stage, $D_{IN}$ is a logical "1" if $V_{IN}^+ > 0$ and is a logical "0" if $V_{IN}^+ < 0$.

Referring to FIG. 4, suppose that near the end of the switching interval defined by $[0, T_1]$, and near the end of the switching interval defined by $[T_1, T]$, the input differential voltage signals at $V_r^+$ port 316 and $V_r^-$ port 318 approach $V_{ref}$ and $-V_{ref}$, respectively. That is, $V_r^+ \to V_{ref}$ and $V_r^- \to -V_{ref}$ for $t \to T_1$ and for $t \to T$. Then, if capacitors 316 and 318 have equal capacitances, and if capacitors 320 and 322 have equal capacitances ($C_1 = C_2$) then it can be shown that the output differential signals are given by $V_{OUT}^+ = 2V_{IN}^+ - \text{sign}(D_{IN})V_{ref}$ and $V_{OUT}^- = 2V_{IN}^- + \text{sign}(D_{IN})V_{ref}$, where sign$(D_{IN}) = 1$ if $D_{IN}$ is a logical "1" and sign$(D_{IN}) = -1$ if $D_{IN}$ is a logical "0". To form a pipelined ADC, a stage, as illustrated in FIG. 3, is pipelined with another like stage, and so on, until a pipelined ADC is formed. Provided the range of the sampled input differential analog signal to the first stage in a pipelined ADC falls within $[-V_{ref}, V_{ref}]$, the output bits $D_{OUT}$ from each stage constitute the binary representation of the sampled input differential analog signal to the first stage. By grouping the stages of a pipelined, switched capacitor ADC as indicated in FIG. 2, the effective time constant for each stage is $2(C_1+C_2)R_{ESD}$, where for simplicity we have assumed that the capacitances for each stage are equal. Provided this time constant is sufficiently smaller than the switching time intervals $T_1$ and $T-T_1$, the capacitors in a stage will substantially reach their asymptotic states, and the previously described assumption that $V_r^+ \to V_{ref}$ and $V_r^- \to -V_{ref}$ for $t \to T_1$ and for $t \to T$ will be met.

The primary ESD protection as illustrated in FIG. 2 need not be limited to ADCs. Furthermore, groups may comprise different numbers of stages, depending upon the capacitances of the switched capacitors. Although the embodiments described herein were directed toward differential signal circuits, embodiments may also be realized for single-ended circuits. Clearly, may modifications may be made to the disclosed embodiments without departing from the scope of the invention as claimed below.

I claim:

1. A die comprising:
   a pad;
   a switched capacitor circuit comprising a plurality of groups of voltage reference input ports; and
   a plurality of electrostatic discharge resistors coupled to the pad, wherein each electrostatic discharge resistor is coupled to a unique group of voltage reference input ports.

2. The die as set forth in claim 1, further comprising a voltage reference buffer circuit coupled to the pad to provide a reference voltage.

3. The die as set forth in claim 2, the switched capacitor circuit further comprising capacitors, wherein the switched capacitor circuit has switching intervals for which currents flow through the electrostatic discharge resistors to charge or discharge the capacitors.

4. The die as set forth in claim 3, wherein at the end of the switching intervals the currents flowing through the electrostatic discharge resistors cause voltage drops substantially smaller than the reference voltage.

5. The die as set forth in claim 4, wherein the switched capacitor circuit comprises a pipelined, switched capacitor analog-to-digital converter.

6. The die as set forth in claim 3, wherein each electrostatic discharge resistor charges or discharges a unique group of capacitors during the switching intervals, wherein the switching intervals have a period, wherein each electrostatic discharge resistor in combination with its associated group of capacitors defines a RC time constant substantially less than the period of the switching intervals.

7. The die as set forth in claim 6, wherein the switched capacitor circuit comprises a pipelined, switched capacitor analog-to-digital converter.

8. A die comprising:
   a pad;
   a pipelined switched capacitor circuit comprising pipelined groups of at least one stage; and
   a network of electrostatic discharge resistors each having one terminal coupled to the pad and each having one terminal coupled in one-to-one fashion to each group of at least one stage.

9. The die as set forth in claim 8, wherein the switched capacitor circuit has switching intervals, wherein each group of at least one stage comprises capacitors that are coupled to an electrostatic discharge resistor during the switching intervals so as to charge or discharge.

10. The die as set forth in claim 9, wherein the switched capacitor circuit comprises an analog-to-digital converter where each stage provides one bit.

11. The die as set forth in claim 9, wherein for each group of at least one stage, the combination of capacitors coupled to an electrostatic discharge resistor define a RC time constant substantially less than the switching interval.

12. The die as set forth in claim 11, wherein the switched capacitor circuit comprises an analog-to-digital converter where each stage provides one bit.

13. A circuit comprising:
   an integrated circuit comprising
      a pad;
      a switched capacitor circuit having a plurality of groups of voltage reference input ports, wherein each group of voltage reference input ports is coupled to a group of capacitors;
      a voltage reference buffer circuit coupled to the pad to provide a reference voltage; and
      a plurality of resistors coupled to the pad, wherein each resistor is coupled to a unique group of voltage reference input ports to provide primary electro static discharge protection; and
   a capacitor external to the integrated circuit and coupled to the pad.

14. The circuit as set forth in claim 13, wherein the switched capacitor circuit has switching intervals, wherein each resistor of the plurality of resistors is coupled to a unique group of capacitors via the group of voltage reference input ports coupled to the unique group of capacitors so as to charge or discharge the capacitors during the switching intervals.

15. The circuit as set forth in claim 14, wherein the switched capacitor circuit comprises a pipelined analog-to-digital converter.

16. The circuit as set forth in claim 14, wherein for each group of capacitors, the combination of coupled capacitors and resistor define a RC time constant substantially less than the switching interval.

17. The circuit as set forth in claim 16, wherein the switched capacitor circuit comprises a pipelined analog-to-digital converter.

18. A method to provide electrostatic discharge protection to a switched capacitor circuit, the switched capacitor circuit comprising groups of stages wherein each stage has switched capacitors and at least one voltage reference input port to source or sink current to the switched capacitors, the method comprising:
   for each group of stages, sourcing or sinking currents to capacitors during switching intervals through an electrostatic discharge resistor coupled to the at least one voltage reference input port; wherein a separate electrostatic discharge resistor is provided for each group of stages.

19. The method as set forth in claim 18, wherein for each group of stages, the combination of capacitors and electrostatic discharge resistor coupled to the at least one voltage reference input port defines a RC time constant substantially smaller than the switching interval.

20. A communication circuit comprising:
   a pad;
   a voltage reference buffer circuit coupled to the pad to provide a reference voltage;
   a switched capacitor circuit comprising a plurality of groups of voltage reference input ports; and
   a plurality of electrostatic discharge resistors coupled to the pad, wherein each electrostatic discharge resistor is coupled to a unique group of voltage reference input ports; wherein the switched capacitor circuit further comprises capacitors, wherein the switched capacitor circuit has switching intervals for which currents flow through the electrostatic discharge resistors to charge or discharge the capacitors.

21. The communication circuit as set forth in claim 20, wherein at the end of the switching intervals the currents flowing through the electrostatic discharge resistors cause voltage drops substantially smaller than the reference voltage.

22. The communication circuit as set forth in claim 21, wherein the switched capacitor circuit comprises a pipelined switched capacitor analog-to-digital converter.

23. The communication circuit as set forth in claim 20, wherein each electrostatic discharge resistor charges or discharges a unique group of capacitors during the switching intervals, wherein the switching intervals have a period, wherein each electrostatic discharge resistor in combination with its associated group of capacitors defines a RC time constant substantially less than the period of the switching intervals.

24. The communication circuit as set forth in claim 23, wherein the switched capacitor circuit comprises a pipelined switched capacitor analog-to-digital converter.

* * * * *